United States Patent
Lim et al.

(10) Patent No.: US 7,951,671 B2
(45) Date of Patent: May 31, 2011

(54) METHOD OF FABRICATING NON-VOLATILE MEMORY DEVICE HAVING SEPARATE CHARGE TRAP PATTERNS

(75) Inventors: Ju-Wan Lim, Seoul (KR); Hyun-Seok Jang, Suwon-si (KR); Byung-Hong Chung, Seoul (KR); Ki-Hyun Hwang, Seongnam-si (KR); Sang-Ryol Yang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/453,419

(22) Filed: May 11, 2009

(65) Prior Publication Data

US 2009/0221140 A1 Sep. 3, 2009

Related U.S. Application Data

(62) Division of application No. 11/819,850, filed on Jun. 29, 2007, now abandoned.

(30) Foreign Application Priority Data

Nov. 7, 2006 (KR) .................. 10-2006-0109534

(51) Int. Cl.
*H01L 21/336* (2006.01)
(52) U.S. Cl. ........ 438/257; 438/157; 438/201; 438/211; 438/283; 438/294; 257/E21.209; 257/E21.21; 257/E21.422; 257/E21.423; 257/E21.679

(58) Field of Classification Search .................. 438/294, 438/157, 283, 201, 211, 257; 257/E21.209, 257/E21.21, E21.422, E21.423, E21.679
See application file for complete search history.

(56) References Cited

U.S. PATENT DOCUMENTS

| | | | |
|---|---|---|---|
| 6,943,404 B2 | 9/2005 | Huang et al. | |
| 2002/0127805 A1* | 9/2002 | Ebina et al. | ................ 438/266 |
| 2006/0097310 A1 | 5/2006 | Kim et al. | |
| 2006/0180853 A1 | 8/2006 | Ryu et al. | |
| 2006/0202263 A1 | 9/2006 | Lee | |
| 2006/0244070 A1 | 11/2006 | Iwata et al. | |
| 2007/0212880 A1 | 9/2007 | Park et al. | |
| 2007/0262372 A1* | 11/2007 | Yamamoto et al. | ........... 257/324 |
| 2008/0171416 A1 | 7/2008 | Fang et al. | |
| 2008/0265301 A1* | 10/2008 | Fang et al. | .................... 257/315 |

FOREIGN PATENT DOCUMENTS

| | | |
|---|---|---|
| KR | 10-2004-0055174 A | 6/2004 |
| KR | 10-2004-0064053 A | 7/2004 |
| KR | 10-2005-0093807 A | 9/2005 |
| KR | 10-2006-0041375 A | 5/2006 |
| KR | 10-2006-0099690 A | 9/2006 |

* cited by examiner

*Primary Examiner* — Long K Tran
(74) *Attorney, Agent, or Firm* — Lee & Morse, P.C.

(57) ABSTRACT

A method of fabricating a non-volatile memory device includes forming an isolation trench in a semiconductor substrate, and the isolation trench defines first and second fins. The method further includes forming an isolation layer partially filling the isolation trench, forming first and second charge trap patterns respectively covering parts of the first and second fins projecting from the isolation layer, and forming a control gate electrode covering the first and second charge trap patterns and crossing the first and second fins.

16 Claims, 8 Drawing Sheets

METHOD OF FABRICATING NON-VOLATILE MEMORY DEVICE HAVING SEPARATE CHARGE TRAP PATTERNS

CROSS REFERENCE TO RELATED APPLICATION(S)

This is a divisional application based on application Ser. No. 11/819,850, filed Jun. 29, 2007 now abandoned, the entire contents of which is hereby incorporated by reference.

BACKGROUND OF THE INVENTION

1. Field of the Invention

Embodiments of the present invention relate to a non-volatile semiconductor device and a method of fabricating the same. More particularly, embodiments of the present invention relate to a non-volatile memory device having separate charge trap patterns and a method of fabricating the same.

2. Description of the Related Art

Semiconductor memory devices storing data may be classified into volatile memory devices and non-volatile memory devices. While the volatile memory devices lose stored data when a power supply is interrupted, the non-volatile memory devices retain the stored data even when the power supply is interrupted. Accordingly, non-volatile memory devices, e.g., flash memory devices, find wide applications in portable storage devices or mobile telecommunication systems.

Meanwhile, as electronic systems gradually become smaller and require low-power consumption components, the flash memory devices may have to be highly integrated. Therefore, the size of a gate constituting a unit cell of the flash memory device may also have to be scaled down.

Recently, to scale down the size of the gate, a technology of fabricating the flash memory cell by forming a charge trap layer and a control gate on an active region having a fin structure has been developed. Also, a technology employing an insulating layer, e.g., a silicon nitride layer, as the charge trap layer may be considered. NAND-type flash memory devices may be especially amenable to high integration because a number of cells share one contact.

FIG. 1 illustrates a cross-sectional view taken along a word line direction of unit cells of a related art NAND-type flash memory device having a charge trap layer.

Referring to FIG. 1, first and second fins 12A and 12B may be formed on a semiconductor substrate 11 by sinking an isolation trench 13T. An isolation layer 13 may partially fill the isolation trench 13T. The first and second fins 12A and 12B may thus each have a part that projects upward from the isolation layer 13.

A charge trap layer 17 may be applied along a surface of the isolation layer 13, and surfaces of the first and second fins 12A and 12B may project upward from the isolation layer 13. The charge trap layer 17 may be, e.g., a silicon nitride layer. A first tunnel dielectric layer 15A may be between the charge trap layer 17 and the first fin 12A, and a second tunnel dielectric layer 15B may be between the charge trap layer 17 and the second fin 12B.

A control gate electrode 21 may cross over the first and second fins 12A and 12B. The control gate electrode 21 may serve as a word line. A control dielectric layer 19 may be between the control gate electrode 21 and the charge trap layer 17.

Flash memory cells C1 and C2 may be provided at crossing points of the control gate electrode 21 and the fins 12A and 12B, respectively. That is, the first flash memory cell C1 may be provided at the crossing point of the control gate electrode 21 and the first fin 12A, and the second flash memory cell C2 may be provided at the crossing point of the control gate electrode 21 and the second fin 12B.

Electrons may be injected into the charge trap layer 17 by a program operation of the memory cells C1 and C2. The electrons may be injected into the charge trap layer 17 between the first fin 12A and the control gate electrode 21 by the program operation of the first flash memory cell C1. The electrons may also be similarly injected into the charge trap layer 17 between the second fin 12B and the control gate electrode 21 by the program operation of the second flash memory cell C2.

However, the charge trap layers 17 of the first and second flash memory cells C1 and C2 may have a connected structure. The connected structure of the charge trap layers 17 may provide a path for spreading charges. That is, the electrons injected into the charge trap layer 17 may be spread to an adjacent region due to the connected structure of the charge trap layers 17, as indicated by the arrows in FIG. 1. The charge spreading may lead to bad data retention of the memory cells C1 and C2 and malfunction of adjacent memory cells.

The above information disclosed in this Background section is only for enhancement of understanding of the background of the invention, and therefore it may contain information that does not form the prior art that is already known in this country to a person of ordinary skill in the art.

SUMMARY OF THE INVENTION

Embodiments of the present invention are therefore directed to non-volatile memory device, which substantially overcomes one or more of the problems due to the limitations and disadvantages of the related art.

It is therefore a feature of an embodiment of the present invention to provide a non-volatile memory device having separate charge trap patterns in order to prevent charge spreading.

It is therefore another feature of an embodiment of the present invention to provide a method of fabricating a non-volatile memory device having separate charge trap patterns in order to prevent charge spreading.

At least one of the above and other features and advantages of the present invention may be realized by providing a non-volatile memory device that may include an isolation trench in a semiconductor substrate, an isolation layer partially filling the isolation trench between first and second fins defined by the isolation trench, a control gate electrode crossing the first and second fins, a first charge trap pattern between the first fin and the control gate electrode, and a second charge trap pattern between the second fin and the control gate electrode.

The first and second charge trap patterns may each be an insulating layer. The first and second charge trap patterns may be each be a nitride layer. The first and second charge trap patterns may cover parts of the first and second fins projecting from the isolation layer. A distance between the first and second charge trap patterns may be smaller than a resolution limit of a photolithography process. A tunnel dielectric layer may be between the first and second charge trap patterns, and the first and second fins. The control gate electrode may cover parts of the first and second fins projecting from the isolation layer. A control dielectric layer may be at a lower part of the control gate electrode. The control dielectric layer may be between the first and second charge trap patterns and the control gate electrode, and the control dielectric layer may extend to be in contact with the isolation layer between the first and second charge trap patterns.

At least one of the above and other features and advantages of the present invention may be realized by providing a method of fabricating a non-volatile memory device, which may include forming an isolation trench in a semiconductor substrate, the isolation trench defining first and second fins, forming an isolation layer partially filling the isolation trench, forming first and second charge trap patterns respectively covering parts of the first and second fins projecting from the isolation layer, and forming a control gate electrode covering the first and second charge trap patterns and crossing the first and second fins.

The charge trap patterns may each be an insulating layer. The charge trap patterns may each be a nitride layer. Forming the first and second charge trap patterns may include forming a charge trap layer along a surface of the isolation layer and surfaces of the fins projecting from the isolation layer, forming sacrificial patterns covering the charge trap layer on the fins and exposing the charge trap layer on the isolation layer, and removing the exposed charge trap layer. The sacrificial patterns may be formed of a material having an etch selectivity with respect to the charge trap layer. Forming the sacrificial patterns may include forming a sacrificial layer on the charge trap layer, forming a capping pattern partially filling a gap between the first and second fins, the sacrificial layer on the isolation layer being covered by the capping pattern and the sacrificial layer projecting from the capping pattern being exposed, oxidizing the exposed sacrificial layer, and removing the capping pattern and the sacrificial layer remaining under the capping pattern. The sacrificial layer may be formed from a material having an etch selectivity with respect to the charge trap layer. The sacrificial layer may be formed from silicon. Forming the capping pattern may include forming a capping layer filling a gap between the first and second fins, and etching-back the capping layer. The capping pattern may be formed of a material layer having an etch selectivity with respect to the sacrificial layer. The capping pattern may be formed from nitride.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

In FIGS. 3 to 12, section "1" is a cross-sectional view taken along line I-I' of FIG. 2, and section "2" is a cross-sectional view taken along line II-II' of FIG. 2.

DETAILED DESCRIPTION OF THE INVENTION

Figure 1:
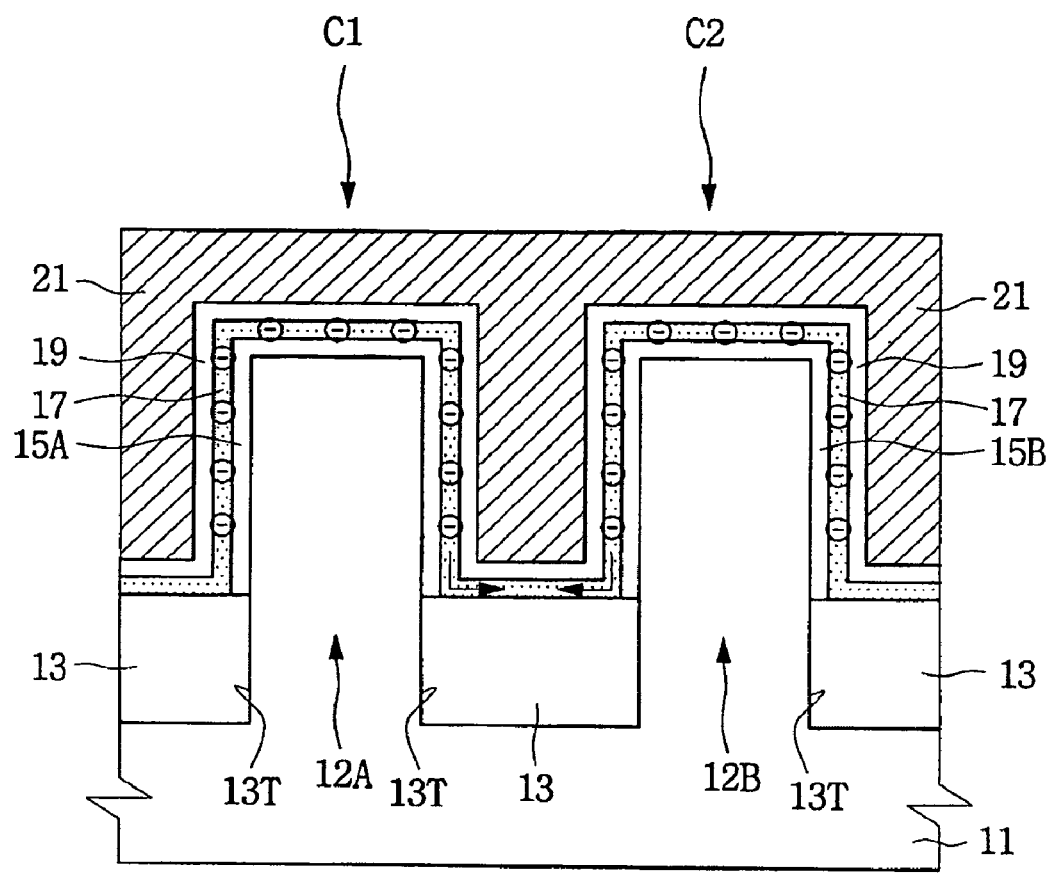
FIG. 1 illustrates a cross-sectional view of a related art non-volatile memory device having a charge trap layer.

Korean Patent Application No. 10-2006-0109534, filed on Nov. 7, 2006, in the Korean Intellectual Property Office, and entitled: "Non-Volatile Memory Device Having Separate Charge Trap Patterns and Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

According to the present invention, a non-volatile memory device may include a first charge trap pattern on a first fin, and a second charge trap pattern on a second fin. The first and second charge trap patterns may be spaced apart from each other. The first and second charge trap patterns may be formed of an insulating layer, e.g., a nitride layer. The charge trap patterns may be insulated from adjacent charge trap patterns by a tunnel dielectric layer and a control dielectric layer, respectively. Thus, spreading of electrons injected into the charge trap patterns may be prevented. The non-volatile memory device may thus prevent charge spreading.

Figure 2:
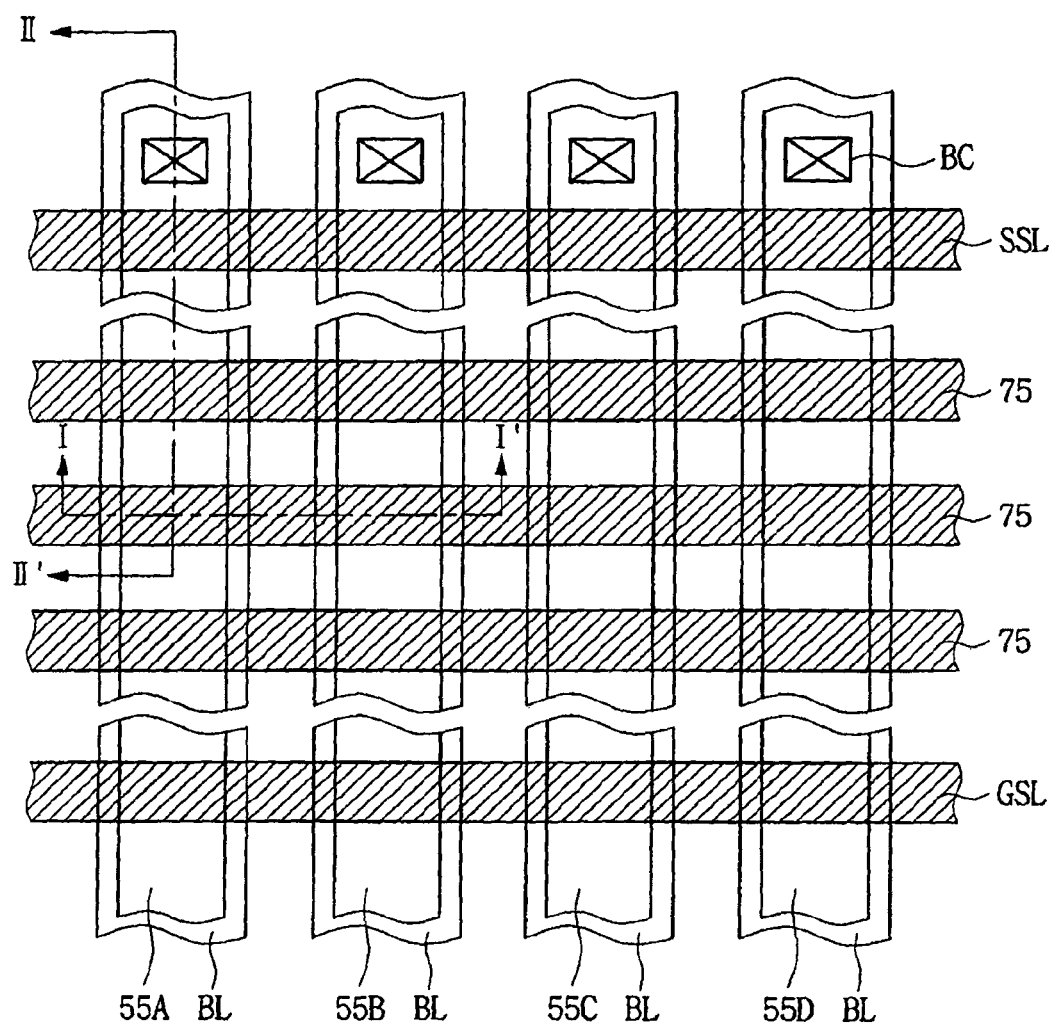
FIG. 2 illustrates a plan view of a cell array region of a non-volatile memory device according to an exemplary embodiment of the present invention.
Figure 3:
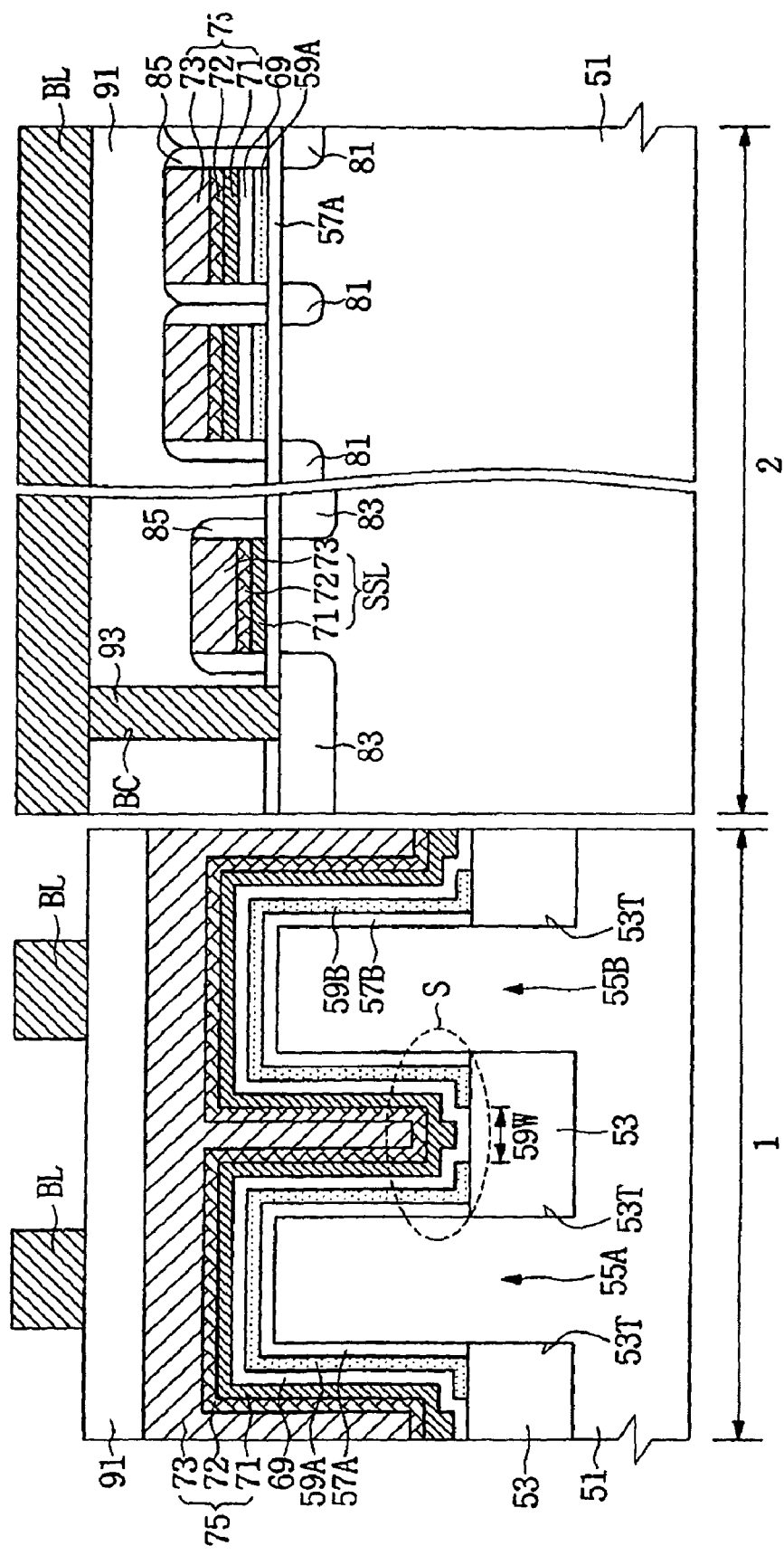
FIG. 3 illustrates a cross-sectional view of a non-volatile memory device according to an exemplary embodiment of the present invention.

FIG. 2 illustrates a plan view of a cell array region of a NAND-type flash memory device according to an exemplary embodiment of the present invention, and FIG. 3 illustrates a cross-sectional view of a NAND-type flash memory device according to an exemplary embodiment of the present invention. In FIG. 3, section "1" is a cross-sectional view taken along line I-I' of FIG. 2, and section "2" is a cross-sectional view taken along line II-II' of FIG. 2.

Referring to FIGS. 2 and 3, first to fourth fins 55A, 55B, 55C, and 55D may be formed by sinking isolation trenches 53T in a semiconductor substrate 51. The semiconductor substrate 51 may be, e.g., a silicon wafer, a silicon-on-insulator (SOI) wafer, etc. An isolation layer 53 may partially fill the isolation trenches 53T between the first to fourth fins 55A, 55B, 55C, and 55D. That is, the first to fourth fins 55A, 55B, 55C, and 55D may include a part projecting from the isolation layer 53. The isolation layer 53 may include an insulating layer, e.g., a silicon oxide layer.

A string selection line SSL and a ground selection line GSL may cross over the first to fourth fins 55A, 55B, 55C, and 55D. When viewed from the plan view illustrated in FIG. 2, the first to fourth fins 55A, 55B, 55C, and 55D may be substantially parallel to each other in a column direction. The string and ground selection lines SSL and GSL may be parallel to each other in a row direction.

Multiple control gate electrodes 75 may be provided between the string selection line SSL and the ground selection line GSL. The control gate electrodes 75 may cross over the first to fourth fins 55A, 55B, 55C, and 55D. The control gate electrodes 75 may be substantially parallel to each other in a row direction. The control gate electrodes 75 may extend to fill gap regions between the first to fourth fins 55A, 55B, 55C, and 55D. The control gate electrodes 75 may serve as word lines.

The control gate electrodes 75 may each include a first conductive layer 71, a second conductive layer 72 and a third conductive layer 73, which may be sequentially stacked. The string and ground selection lines SSL and GSL may also include the first to third conductive layers 71 to 73. The first conductive layer 71 may be, e.g., a tantalum nitride (TaN) layer, the second conductive layer 72 may be, e.g., a tungsten nitride (WN) layer, and the third conductive layer 73 may be, e.g., a tungsten (W) layer.

Charge trap patterns 59A and 59B may be at crossing points of the control gate electrodes 75 and the first to fourth fins 55A, 55B, 55C, and 55D. The charge trap patterns 59A and 59B may be, e.g., an insulating layer. The charge trap patterns 59A and 59B may be, e.g., a nitride layer, a silicon nitride layer, etc.

The charge trap patterns 59A and 59B may include a first charge trap pattern 59A and a second charge trap pattern 59B. The first charge trap pattern 59A may cover a part of the first fin 55A projecting from the isolation layer 53. The second charge trap pattern 59B may cover a part of the second fin 55B projecting from the isolation layer 53.

As illustrated in the region shown in dotted line S of FIG. 3, the first and second charge trap patterns 59A and 59B may be spaced apart. A distance 59W between the first and second charge trap patterns 59A and 59B may be smaller than a resolution limit of a photolithography process. That is, the first and second charge trap patterns 59A and 59B may have a structure advantageous to high integration.

A first tunnel dielectric layer 57A may be between the first charge trap pattern 59A and the first fin 55A. A part of the first fin 55A projecting from the isolation layer 53 may be covered by the first tunnel dielectric layer 57A. A second tunnel dielectric layer 57B may be between the second charge trap pattern 59B and the second fin 55B. That is, the part of the second fin 55B projecting from the isolation layer 53 may also be covered by the second tunnel dielectric layer 57B.

The tunnel dielectric layers 57A and 57B may be, e.g., silicon oxide layers, thermal oxide layers, etc. The charge trap patterns 59A and 59B may be insulated from the fins 55A and 55B by the tunnel dielectric layers 57A and 57B.

A control dielectric layer 69 may be under the control gate electrodes 75. The control dielectric layer 69 may be a different material layer from the charge trap patterns 59A and 59B. The control dielectric layer 69 may be, e.g., a silicon oxide layer, a high-k dielectric layer, etc. The charge trap patterns 59A and 59B may be insulated from the control gate electrodes 75 by the control dielectric layer 69. The control dielectric layer 69 may be in contact with the isolation layer 53 between the first and second charge trap patterns 59A and 59B.

Spacers 85 may be on sidewalls of the control gate electrodes 75, the string selection line SSL, and the ground selection line GSL. The spacers 85 may be formed of an insulating layer, e.g., a silicon oxide layer, a silicon nitride layer, a silicon oxynitride layer, etc.

Source and drain regions 81 and 83 may be in the first to fourth fins 55A, 55B, 55C, and 55D, which may be adjacent to both sides of the control gate electrodes 75, the string selection line SSL, and the ground selection line GSL. The source and drain regions 81 and 83 may be, e.g., high-concentration impurity regions.

The semiconductor substrate 51 having the control gate electrodes 75, the string selection line SSL and the ground selection line GSL may be covered by an interlayer insulating layer 91. The interlayer insulating layer 91 may be, e.g., a silicon oxide layer.

Bit lines BL may be on the interlayer insulating layer 91. The bit lines BL may be parallel to each other in a column direction. The bit lines BL may be electrically connected to the source and drain regions 83, which may be adjacent to the string selection line SSL and opposite to the ground selection line GSL, by bit plugs 93 passing through the interlayer insulating layer 91. The bit lines BL and the bit plugs 93 may be formed of, e.g., a conductive layer.

According to the exemplary embodiment of the present invention described above, the first charge trap pattern 59A may be insulated from the second charge trap pattern 59B by the first tunnel dielectric layer 57A and the control dielectric layer 69. The second charge trap pattern 59B may be insulated from the first charge trap pattern 59A by the second tunnel dielectric layer 57B and the control dielectric layer 69. That is, each of the charge trap patterns 59A and 59B may be insulated from adjacent charge trap patterns by the tunnel dielectric layers 57A and 57B, and the control dielectric layer 69.

In the NAND-type flash memory device according to the exemplary embodiment of the present invention, electrons may be injected into the charge trap patterns 59A and 59B by employing a program operation. The electrons injected into the charge trap patterns 59A and 59B may be blocked from being spread into an adjacent region by the tunnel dielectric layers 57A and 57B, and the control dielectric layer 69. Accordingly, data retention characteristics of the charge trap patterns 59A and 59B may be significantly improved. Also, malfunctions caused by interference between adjacent charge trap patterns may be prevented. Consequently, a NAND flash memory device which may prevent charge spreading may be obtained.

FIGS. 4 to 12 illustrate cross-sectional views of a method of fabricating a NAND-type flash memory device according to an exemplary embodiment of the present invention. Throughout FIGS. 4 to 12, section "1" is a cross-sectional view taken along line I-I' of FIG. 2.

Figure 4:
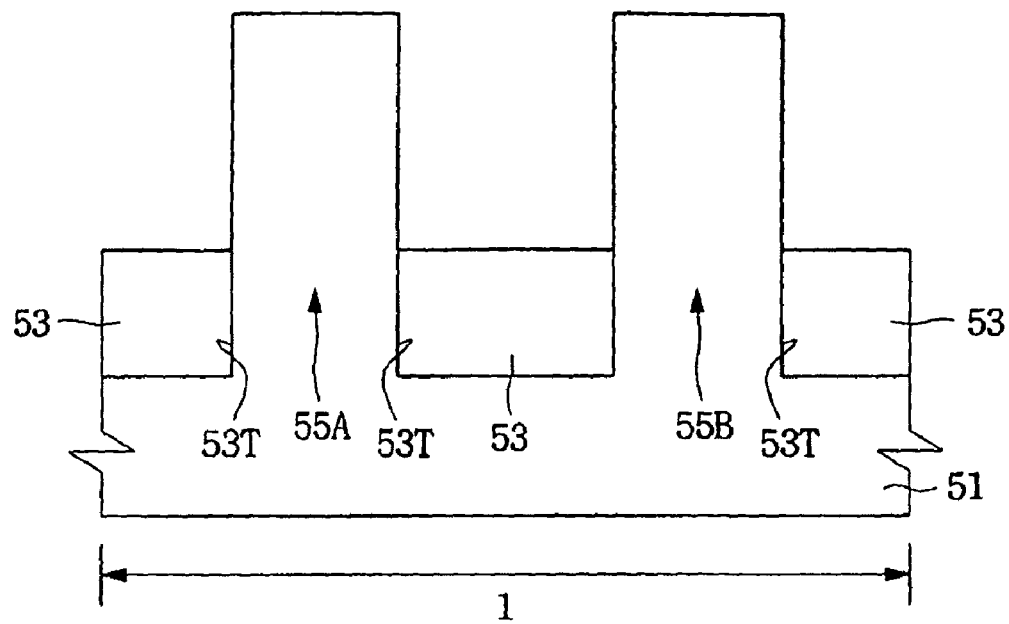
FIGS. 4 to 12 illustrate cross-sectional views of stages of a method of fabricating a non-volatile memory device according to an exemplary embodiment of the present invention.
Figure 5:
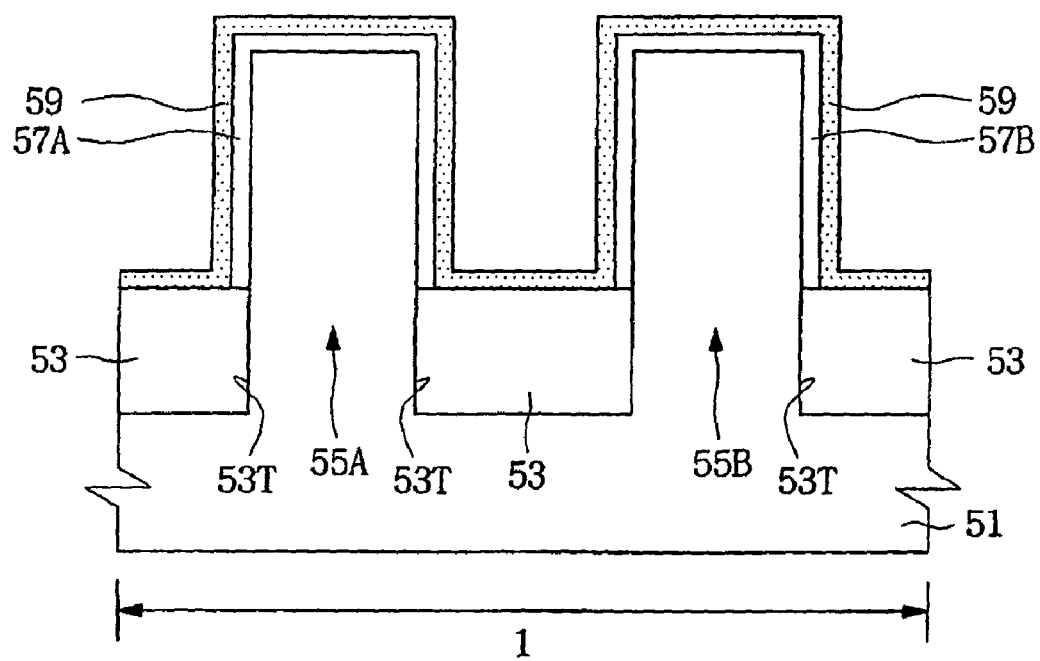

Referring to FIGS. 2 and 4, first to fourth fins 55A, 55B, 55C, and 55D may be defined by forming isolation trenches 53T in the semiconductor substrate 51. The fins 55A, 55B, 55C, and 55D may include the first fin 55A, the second fin 55B, the third fin 55C and the fourth fin 55D, which may be formed parallel to one another in a column direction. The isolation trenches 53T may be formed by, e.g., a well-known patterning technique.

An insulating layer filling the isolation trench 53T and covering a top surface of the semiconductor substrate 51 may be formed. The insulating layer may be recessed to form an isolation layer 53, which may partially fill the isolation trench 53T. The isolation layer 53 may remain at a lower region in the isolation trench 53T. Recessing the insulating layer may be performed by, e.g., an etch-back process, a chemical mechanical polishing (CMP) process, a combination thereof, etc. As a result, the first to fourth fins 55A, 55B, 55C, and 55D may have parts projecting from the isolation layer 53. Also, the parts of the first to fourth fins 55A, 55B, 55C, and 55D, which project from the isolation layer 53, may be exposed.

The isolation layer 53 may be an insulating layer formed from, e.g., silicon oxide. The isolation layer 53 may have a sidewall oxide layer (not illustrated) and a nitride layer liner (not illustrated), which may be formed along sidewalls of the first to fourth fins 55A, 55B, 55C, and 55D.

Referring to FIGS. 2 to 5, tunnel dielectric layers 57A and 57B may be formed on exposed surfaces of the first to fourth fins 55A, 55B, 55C, and 55D. The tunnel dielectric layers 57A and 57B may be a thermal oxide layer formed from, e.g., silicon oxide. In this case, the formation of the thermal oxide layer may be prevented on a surface of the isolation layer 53. Thus, the first tunnel dielectric layer 57A may be formed along the surface of the first fin 55A, which may project from the isolation layer 53. The second tunnel dielectric layer 57B may similarly be formed along the surface of the second fin 55B, which may project from the isolation layer 53.

Alternatively, the first and second tunnel dielectric layers 57A and 57B may be formed by, e.g., a chemical vapor deposition (CVD) method, an atomic layer deposition (ALD) method, etc. Also, the tunnel dielectric layers 57A and 57B may be formed of, e.g., a high-k dielectric layer, a silicon oxide layer, a silicon oxynitride layer, a combination thereof, etc. The first and second tunnel dielectric layers 57A and 57B may also be formed on the surface of the isolation layer 53. The following description will assume that the tunnel dielectric layers 57A and 57B are thermal oxide layers.

A charge trap layer 59 may be formed on the semiconductor substrate 51 having the tunnel dielectric layers 57A and 57B. The charge trap layer 59 may be formed from a material layer that is different from the tunnel dielectric layers 57A and 57B. The charge trap layer 59 may be, e.g., a nitride layer, a silicon nitride layer, etc. For example, the silicon nitride layer may be formed employing, e.g., a low pressure chemical vapor deposition (LPCVD) apparatus, an ALD apparatus, etc.

The charge trap layer 59 may be formed along the surfaces of the tunnel dielectric layers 57A and 57B and the isolation layer 53. That is, the charge trap layer 59 may cover the tunnel dielectric layers 57A and 57B. Also, the charge trap layer 59 may cover the top surface of the isolation layer 53. As a result, the charge trap layer 59 formed on the first fin 55A and the charge trap layer 59 formed on the second fin 55B may be connected to each other by the charge trap layer 59 covering the top surface of the isolation layer 53.

Figure 6:
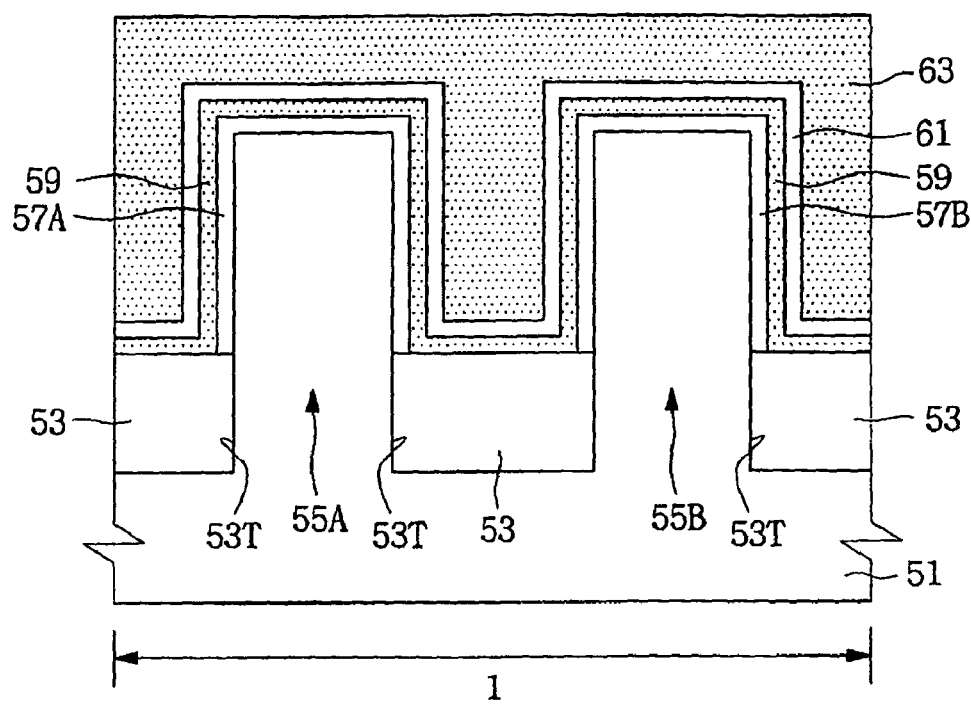

Referring to FIGS. 2 and 6, a sacrificial layer 61 may be formed along a surface of the charge trap layer 59. The sacrificial layer 61 may be a material layer having an etch selectivity with respect to the charge trap layer 59. The sacrificial layer 61 may also be a material layer having a high surface oxidation rate. The sacrificial layer 61 may be, e.g., a silicon layer. The silicon layer may be formed employing, e.g., an LPCVD apparatus, an ALD apparatus, etc.

A capping layer 63 may be formed on the semiconductor substrate 51 having the sacrificial layer 61. The capping layer 63 may be a material layer with an etch selectivity with respect to the sacrificial layer 61. By "etch selectivity," different etch rates under the same conditions may be observed for the capping layer 63 and the sacrificial layer 61. The capping layer 63 may also be a material layer having a lower surface oxidation rate than the sacrificial layer 61. The capping layer 63 may be, e.g., a silicon nitride layer. The capping layer 63 may fill gap regions between the first to fourth fins 55A, 55B, 55C, and 55D. The capping layer 63 may be formed using, e.g., an LPCVD apparatus, a plasma-enhanced chemical vapor deposition (PECVD) apparatus, etc.

Figure 7:
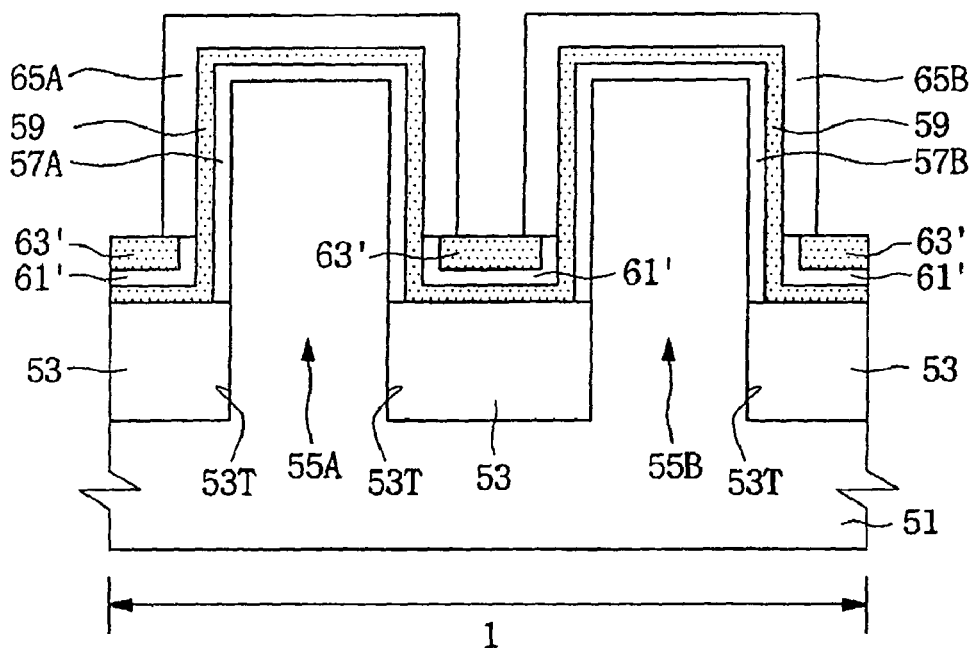

Referring to FIGS. 2 and 7, the capping layer 63 may be etched-back, thereby forming a capping pattern 63'. The etch-back of the capping layer 63 may be performed by a wet process employing, e.g., a phosphoric acid ($H_3PO_4$) solution. A dry etching process may also be used. The capping pattern 63' may cover the sacrificial layer 61 on the isolation layer 53. The capping pattern 63' may remain at lower parts in the gap regions between the first to fourth fins 55A, 55B, 55C, and 55D. As a result, the sacrificial layer 61 covering the part projecting from the capping pattern 63' may be exposed.

Sacrificial patterns 65A and 65B may be formed in the semiconductor substrate 51 having the partially exposed sacrificial layer 61 by employing, e.g., an oxidation process. The oxidation process may include, e.g., a thermal oxidation process, a plasma oxidation process, etc. When the sacrificial layer 61 is, e.g., a silicon layer, the sacrificial patterns 65A and 65B may be formed of, e.g., a silicon oxide layer. Accordingly, the part of the charge trap layer 59 projecting from the capping pattern 63' may be covered by the first and second sacrificial patterns 65A and 65B. The first sacrificial pattern 65A may cover a top surface of the first fin 55A, and the second sacrificial pattern 65B may cover a top surface of the second fin 55B.

In this case, the sacrificial layer 61 may remain under the capping pattern 63'. The remaining sacrificial layer 61' may cover the charge trap layer 59 on the isolation layer 53.

During the oxidation process, formation of an oxidation layer on a surface of the capping pattern 63' may be prevented. If an oxidation layer, which may be very thin, is formed on the surface of the capping pattern 63', a surface of the capping pattern 63' may be exposed by employing a cleaning or etching process. The cleaning or etching process may employ a solution containing, e.g., hydrofluoric acid.

Figure 8:
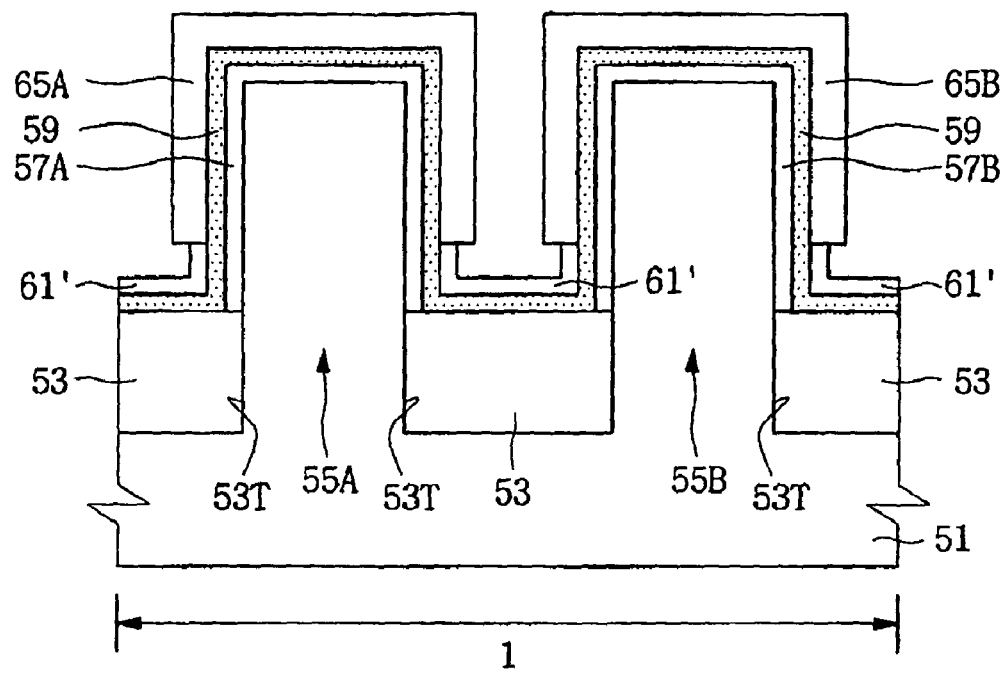

Referring to FIGS. 2 and 8, the capping pattern 63' may be removed to expose the remaining sacrificial layer 61'. The removal of the capping pattern 63' may be performed by, e.g., a wet process using phosphoric acid ($H_3PO_4$) solution.

Figure 9:
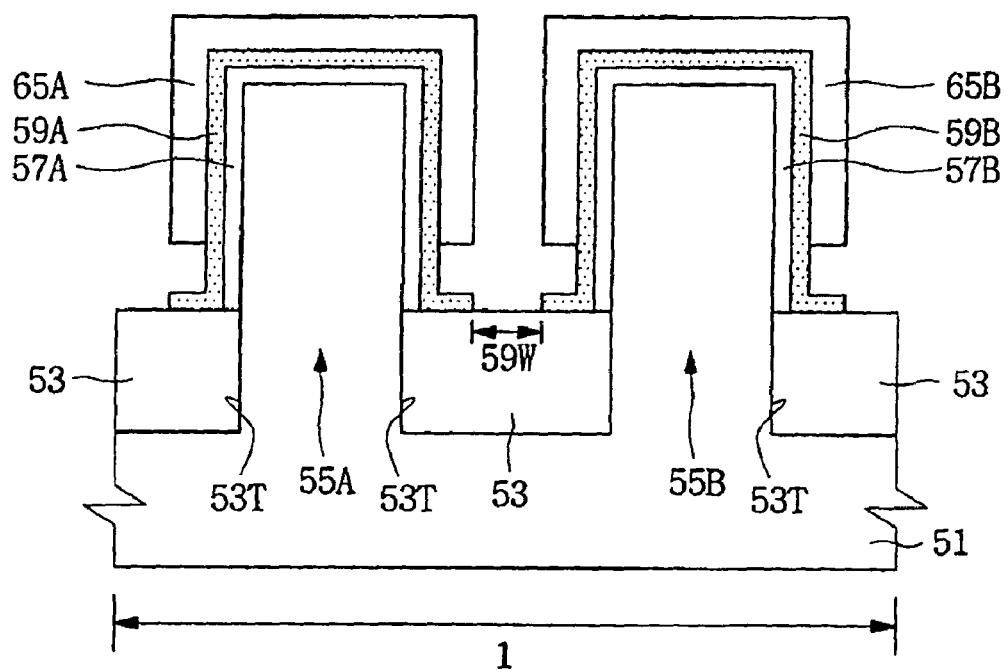

Referring to FIGS. 2 and 9, the remaining sacrificial layer 61' may be removed to expose the charge trap layer 59 on the isolation layer 53. A sufficient etch selectivity may be obtained between the sacrificial patterns 65A and 65B, and the remaining sacrificial layer 61'. Accordingly, the removal of the remaining sacrificial layer 61' may be performed by either a dry or wet process.

The exposed charge trap layer 59 may be removed to form first and second charge trap patterns 59A and 59B. The removal of the exposed charge trap layer 59 may be performed by an anisotropic etching process. Reactive ion etch (RIE) may be used as the anisotropic etching process. Alternatively, the removal of the exposed charge trap layer 59 may be performed by an isotropic etching process. The distance 59W between the first and second charge trap patterns 59A and 59B may be determined by a gap between the first and second sacrificial patterns 65A and 65B.

As described above, the first and second charge trap patterns 59A and 59B may be formed without employing a separate photolithography process. Accordingly, the first and second charge trap patterns 59A and 59B may be self-aligned on the first and second fins 55A and 55B, respectively. Also, the distance 59W may be smaller than the resolution limit of the photolithography process. That is, the first and second charge trap patterns 59A and 59B may be formed to have a structure advantageous to high integration.

Figure 10:
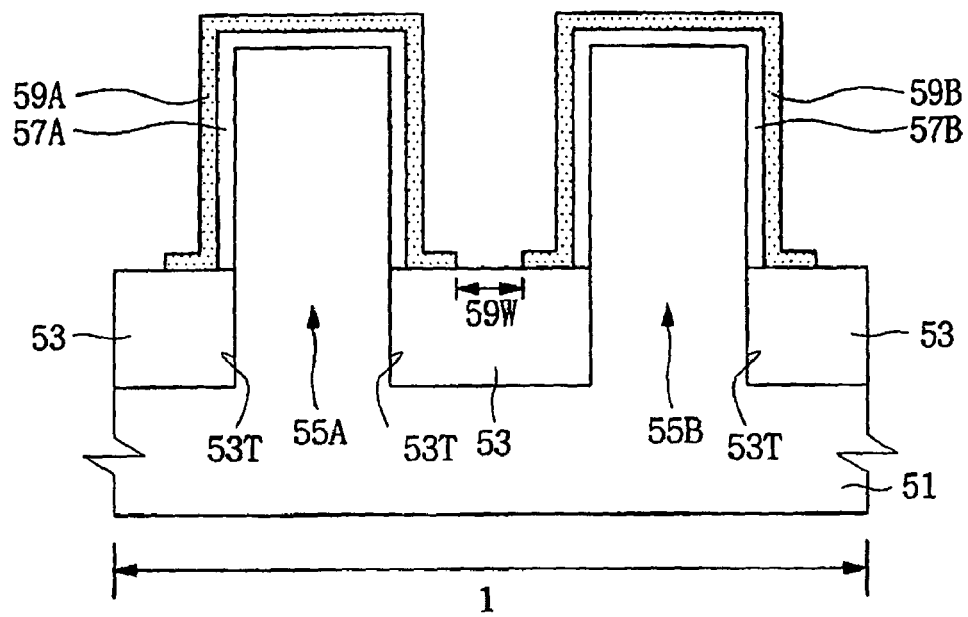

Referring to FIGS. 2 and 10, the sacrificial patterns 65A and 65B may be removed to expose the charge trap patterns 59A and 59B. The sacrificial patterns 65A and 65B may be removed using a solution containing, e.g., hydrofluoric acid.

Consequently, the first charge trap pattern 59A may cover the part of the first fin 55A projecting from the isolation layer 53, and the second charge trap pattern 59B may cover the part of the second fin 55B projecting from the isolation layer 53. Also, the first charge trap pattern 59A may be insulated from the first fin 55A by the first tunnel dielectric layer 57A. The second charge trap pattern 59B may also be insulated from the second fin 55B by the second tunnel dielectric layer 57B.

Figure 11:
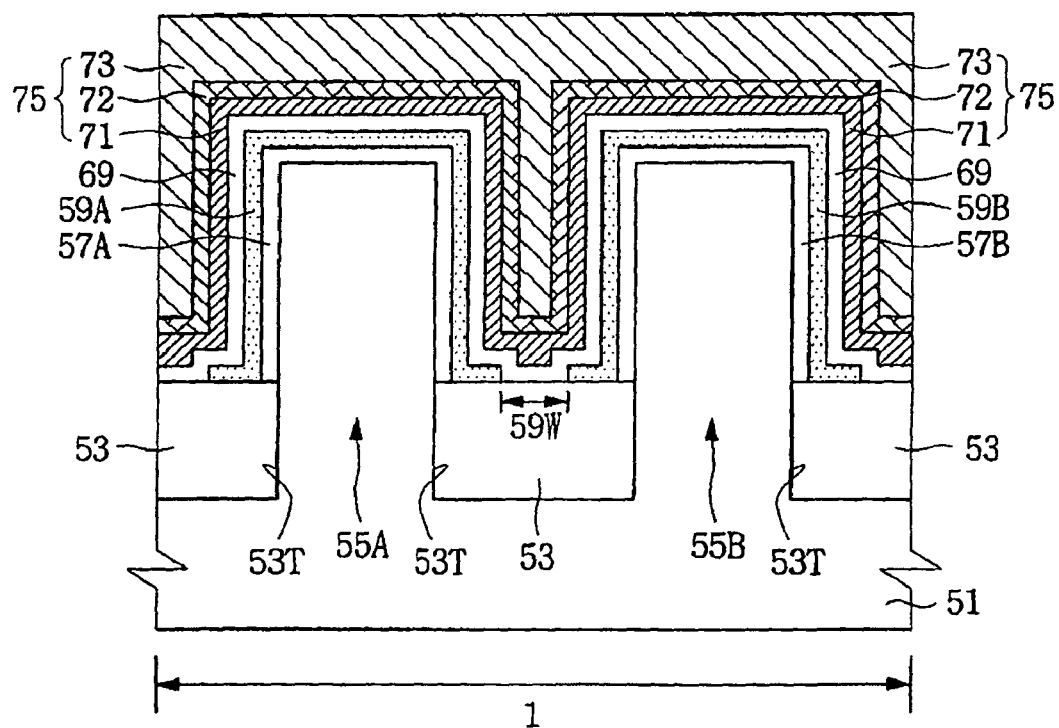

Referring to FIGS. 2 and 11, a control dielectric layer 69 may be formed on the semiconductor substrate 51 having the charge trap patterns 59A and 59B. The control dielectric layer 69 may be, e.g., a silicon oxide layer, a high-k dielectric layer, etc. For example, the control dielectric layer 69 may be, e.g., an aluminum oxide layer.

The control dielectric layer 69 may be formed along the surfaces of the charge trap patterns 59A and 59B and the isolation layer 53. Between the first and second fins 55A and 55B, the control dielectric layer 69 may be in contact with the isolation layer 53.

Control gate electrodes 75 crossing over the first to fourth fins 55A, 55B, 55C, and 55D may be formed on the semiconductor substrate 51 having the control dielectric layer 69. The control gate electrodes 75 may be formed by sequentially depositing and patterning a first conductive layer 71, a second conductive layer 72, and a third conductive layer 73. The first conductive layer 71 may be, e.g., a TaN layer, the second conductive layer 72 may be, e.g., a WN layer, and the third conductive layer 73 may be, e.g., a W layer.

While forming the control gate electrodes 75, the control dielectric layer 69 may also be patterned. In this case, the control dielectric layer 69 may remain under the control gate electrodes 75. The control gate electrodes 75 may also be formed to fill gap regions between the first to fourth fins 55A, 55B, 55C, and 55D. The charge trap patterns 59A and 59B may be insulated from the control gate electrodes 75 by the control dielectric layer 69.

Figure 12:
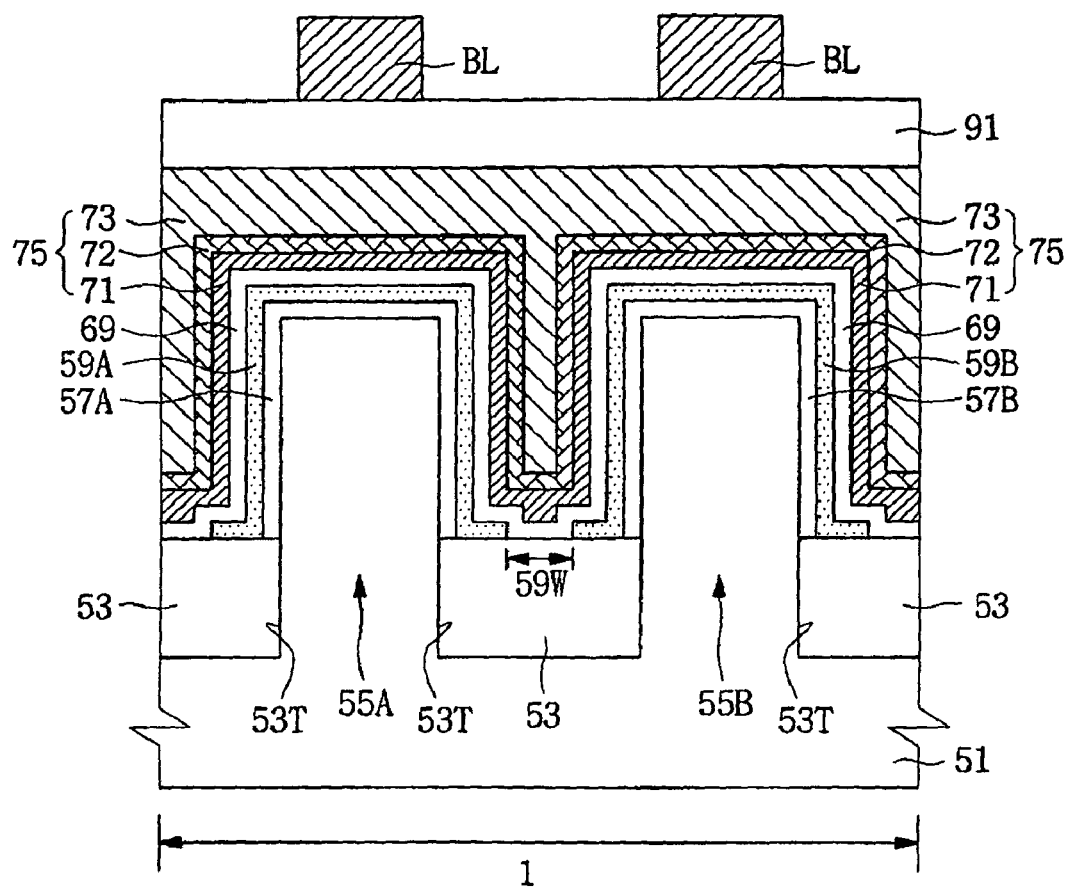

Referring to FIGS. 2 and 12, the interlayer insulating layer 91 may be formed on the semiconductor substrate 51 having the control gate electrodes 75. The interlayer insulating layer 91 may be an insulating layer, e.g., a silicon oxide layer. Bit lines BL may be on the interlayer insulating layer 91. The bit lines BL may be, e.g., a conductive layer.

Referring again to FIGS. 2 and 3, while forming the control gate electrodes 75, the string selection line SSL and the ground selection line GSL may be formed. For example, the string selection line SSL may be formed of the first to third conductive layers 71 to 73, which may be sequentially stacked.

Then, source and drain regions 81 and 83 may be formed in the first to fourth fins 55A, 55B, 55C, and 55D, which may be adjacent to both sides of the control gate electrodes 75, the string selection line SSL, and the ground selection line GSL. The source and drain regions 81 and 83 may be high-concentration impurity regions.

The spacers 85 may be formed on sidewalls of the control gate electrodes 75, the string selection line SSL, and the ground selection line GSL. The spacers 85 may be formed of an insulating layer, e.g., a silicon oxide layer, a silicon nitride layer, a silicon oxynitride layer, a combination thereof, etc.

Bit contact holes BC may pass through the interlayer insulating layer 91, and the bit plugs 93 may fill the bit contact holes BC. The bit lines BL may be electrically connected to the source and drain regions 83, which may be adjacent to the string selection line SSL and opposite to the ground selection line GSL, by the bit plugs 93. The bit plugs 93 may be formed of, e.g., a conductive material.

Exemplary embodiments of the present invention have been disclosed herein and, although specific terms are employed, they are used and are to be interpreted in a generic and descriptive sense only, not for purpose of limitation. Accordingly, it will be understood by those of ordinary skill in the art that various changes in form and details may be made without departing from the spirit and scope of the present invention as set forth in the following claims. For example, the present invention may also be applied to a NOR type non-volatile memory device and a method of fabricating the same.

What is claimed is:

1. A method of fabricating a non-volatile memory device, comprising:
   forming an isolation trench in a semiconductor substrate, the isolation trench defining first and second fins;
   forming an isolation layer partially filling the isolation trench;
   forming first and second charge trap patterns respectively covering parts of the first and second fins projecting from the isolation layer, forming the first and second charge trap patterns includes:
      forming a charge trap layer along a surface of the isolation layer and surfaces of the fins projecting from the isolation layer;
      forming sacrificial patterns covering the charge trap layer on the fins and exposing the charge trap layer on the isolation layer, and
      removing the exposed charge trap layer; and
   forming a control gate electrode covering the first and second charge trap patterns and crossing the first and second fins.

2. The method as claimed in claim 1, wherein the charge trap patterns are each an insulating layer.

3. The method as claimed in claim 1, wherein the charge trap patterns are each a nitride layer.

4. The method as claimed in claim 1, wherein the sacrificial patterns are formed of a material having an etch selectivity with respect to the charge trap layer.

5. The method as claimed in claim 1, wherein forming the sacrificial patterns comprises:
   forming a sacrificial layer on the charge trap layer;
   forming a capping pattern partially filling a gap between the first and second fins, the sacrificial layer on the isolation layer being covered by the capping pattern and the sacrificial layer projecting from the capping pattern being exposed;
   oxidizing the exposed sacrificial layer; and
   removing the capping pattern and the sacrificial layer remaining under the capping pattern.

6. The method as claimed in claim 5, wherein the sacrificial layer is formed from a material having an etch selectivity with respect to the charge trap layer.

7. The method as claimed in claim 5, wherein the sacrificial layer comprises silicon.

8. The method as claimed in claim 5, wherein forming the capping pattern comprises:
   forming a capping layer filling a gap between the first and second fins; and
   etching-back the capping layer.

9. The method as claimed in claim 5, wherein the capping pattern is formed of a material layer having an etch selectivity with respect to the sacrificial layer.

10. The method as claimed in claim 5, wherein the capping pattern comprises nitride.

11. The method as claimed in claim 1, wherein removing the exposed charge trap layer includes anisotropically etching the exposed charge trap layer.

12. The method as claimed in claim 1, further comprising forming first and second tunnel dielectric layers between the respective first and second charge trap patterns and the respective first and second fins.

13. The method as claimed in claim 1, further comprising forming a control dielectric layer on the semiconductor substrate having the first and second charge trap patterns before forming the control gate electrode.

14. The method as claimed in claim 1, wherein the control gate electrode is formed to cover the parts of the first and second fins projecting from the isolation layer.

15. The method as claimed in claim 1, wherein the control gate electrode is formed by sequentially stacking a tantalum nitride (TaN) layer, a tungsten nitride (WN) layer, and a tungsten (W) layer.

16. A method of fabricating a non-volatile memory device, comprising:

forming an isolation trench defining first and second fins in a semiconductor substrate;

forming an isolation layer partially filling the isolation trench;

forming first and second charge trap patterns respectively covering parts of the first and second fins projecting from the isolation layer, the forming of the first and second charge trap patterns includes forming a charge trap layer, and removing a portion of the charge trap layer to form the first and second charge trap patterns spaced apart from each other;

forming a control gate electrode covering the first and second charge trap patterns and crossing the first and second fins, the first and second charge trap patterns being spaced apart from each other; and forming a control dielectric layer on the semiconductor substrate having the first and second charge trap patterns before forming the control gate electrode, a portion of the control dielectric layer covering an area on the isolation layer between the first and second charge trap patterns spaced apart from each other.

* * * * *